United States Patent
Berger et al.

(10) Patent No.: US 7,027,348 B2
(45) Date of Patent: Apr. 11, 2006

(54) POWER EFFICIENT READ CIRCUIT FOR A SERIAL OUTPUT MEMORY DEVICE AND METHOD

(75) Inventors: Neal Berger, Cupertino, CA (US); George Chia-Jung Chang, Cupertino, CA (US); Pearl Po-Yee Cheng, Los Altos, CA (US); Anne Pao-Ling Koh, Sunnyvale, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/921,754

(22) Filed: Aug. 17, 2004

(65) Prior Publication Data

US 2006/0039217 A1 Feb. 23, 2006

(51) Int. Cl.
*G11C 8/00* (2006.01)

(52) U.S. Cl. .................. 365/230.03; 365/207; 365/221; 365/240

(58) Field of Classification Search ...................... None
See application file for complete search history.

(56) References Cited

U.S. PATENT DOCUMENTS

| | | | | |
|---|---|---|---|---|
| 3,930,239 | A * | 12/1975 | Salters et al. | 365/240 |
| 4,747,081 | A * | 5/1988 | Heilveil et al. | 365/219 |
| 4,914,630 | A * | 4/1990 | Fujishima et al. | 365/189.04 |
| 4,987,559 | A * | 1/1991 | Miyauchi et al. | 365/189.04 |
| 5,029,130 | A | 7/1991 | Yeh | 365/185.32 |
| 5,222,047 | A * | 6/1993 | Matsuda et al. | 365/230.03 |
| 5,663,922 | A | 9/1997 | Tailliet | 365/240 |
| 5,666,324 | A * | 9/1997 | Kosugi et al. | 365/233 |
| 5,959,900 | A * | 9/1999 | Matsuda | 365/189.05 |
| 6,018,794 | A * | 1/2000 | Kilpatrick | 711/167 |
| 6,097,657 | A | 8/2000 | Ng et al. | 365/226 |
| 6,134,178 | A * | 10/2000 | Yamazaki et al. | 365/233 |
| 6,587,374 | B1 * | 7/2003 | Takagi et al. | 365/185.11 |

* cited by examiner

Primary Examiner—Tan T. Nguyen
(74) Attorney, Agent, or Firm—DLA Piper Rudnick Gray Cary US LLP

(57) ABSTRACT

An integrated circuit memory device has a plurality of memory cells arranged in a plurality of arrays. Each array has a plurality of rows, and a plurality of column lines, and a plurality of row lines connecting to the memory cells in each array. The memory cell in an array is addressable by a column line and a row line. A column address decoder receives a column address signal and selects one or more column lines of each array in response. A row address decoder receives a row address signal and selects a row line of each array in response. The memory device also has a plurality (k) of sense amplifiers, with one sense amplifier associated with each array, connectable to one or more column lines of the array and receives a signal therefrom supplied from an addressed memory cell. The memory device further has a register; and a control circuit. The control circuit receives a read command, and a clock signal, and in response to the read command activates a first plurality (j) of the plurality (k) of sense amplifiers (j<k) for a time period sufficient to sense the signal on a connected column line associated with each of the plurality (j) of sense amplifiers. The control circuit latches the signal into the register; and deactivates the first plurality (j) of sense amplifiers; and serially outputs the signal from the register in response to the clock signal.

8 Claims, 3 Drawing Sheets

POWER EFFICIENT READ CIRCUIT FOR A SERIAL OUTPUT MEMORY DEVICE AND METHOD

TECHNICAL FIELD

The present invention relates to an integrated circuit memory device and a method of reading such a device. More particularly, the present invention relates to a serially read integrated circuit memory device having an efficient power management read circuit.

BACKGROUND OF THE INVENTION

Serially addressed integrated circuit memory devices are well known in the art. See, for example, U.S. Pat. Nos. 5,663,922 and 6,097,657. As shown in U.S. Pat. No. 5,663,922, it is well known in the art to "manage" the reading of the memory device. The shortcoming of U.S. Pat. No. 5,663,922 is that it does not address the problem of saving power; the '922 patent activates all of the sense amplifiers as the address is received and is decoded. As a result, the '922 patent does not teach an integrated circuit memory device with power saving during the read mode as its consideration.

Similarly, U.S. Pat. No. 6,097,657 also does not teach saving power in the read mode to efficiently manage the reading of the device.

Accordingly, there is a need for an integrated circuit memory device that manages or controls the power during the read mode in a serially outputted integrated circuit memory device.

SUMMARY OF THE INVENTION

In the present invention a memory device comprises a plurality of memory cells which are arranged in a plurality of arrays. Each array further has a plurality of column lines and a plurality of row lines connecting to the memory cells in each array. Each memory cell in an array is addressable by a column line and a row line. A column address decoder receives a column address signal and selects one or more column lines of each array. A row address decoder receives a row address signal and selects a row line of each array. The memory device further comprises a plurality (k) of sense amplifiers. One sense amplifier is associated with each array and is connectable to one or more column lines in the array and receives a signal therefrom supplied from an addressed memory cell. The memory device further comprises a register and a control circuit. The control circuit receives a read command and a clock signal. In response to the read command, the control circuit activates a first plurality (j) of the plurality (k) of the sense amplifiers (j<k) for a time period sufficient to sense the signals on a connected column line associated with each of the plurality (j) of sense amplifiers. The control circuit then latches the signal into the register and deactivates the plurality (j) of sense amplifiers and serially outputs the signal from the register in response to the clock signal.

DETAILED DESCRIPTION OF THE INVENTION

Figure 1:
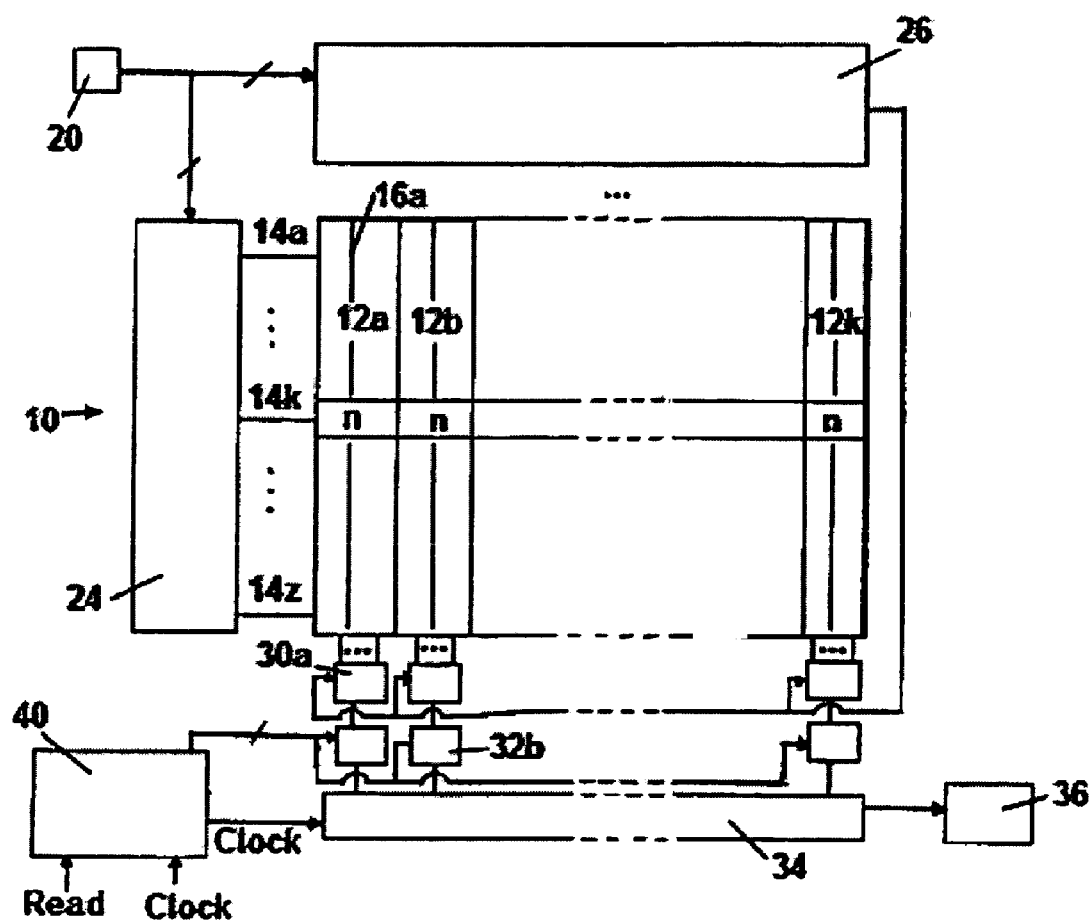
FIG. 1 is a block level schematic diagram of an integrated circuit memory device of the present invention.

Referring to FIG. 1 there is shown a block level diagram of an integrated circuit memory device 10 of the present invention. The device 10 comprises a plurality of arrays 12 (a–k) of memory cells. Each array 12 of memory cells has a plurality of memory cells arranged in a plurality of rows and columns. As is well known in the art, the term rows and columns as used herein, may be interchanged. Each array 12 further has a plurality of row lines 14 and a plurality of column lines 16. Memory cells that are arranged in the same row, e.g. 14a, are connected by the common row line 14a. Memory cells which are arranged in the same column are connected by a common column line, such as column line 16a. Each row in an array 12 comprises n cells. Each of the memory cells at the intersection of a column line and a row line is addressed by an address signal. The address signal is received at an address terminal 20. The address signal is supplied to a row address decoder 24 which receives the row address signal and selects or activates one of the row lines 14 connected to the memory arrays 12 (a–k). The address signal is also supplied to a column address decoder 26. The column address decoder selects or activates one or more column select lines 16 of each array 12.

The column select lines 16 of an array 12 are supplied to a multiplexer 30. Each of the multiplexers 30 is selected by column address decoder 26. In response to the address signal, decoded by the column address decoder 26, the multiplexer 30 selects the selected column select line 16 and provides it to an associated sense amplifier 32. Thus, there is a sense amplifier 32 associated with each of the multiplexer 30 and with each of the array 12. The output of the sense amplifier 32 is supplied to a storage bit in a shift register 34. The contents of the shift register 34 are shifted in serial fashion and are supplied to the output data terminal 36.

The memory device 10 also comprises a control circuit 40 which receives a read command signal and a clock signal. In response to the read command signal, the control circuit 40 activates a first plurality (j) of the plurality (k) of sense amplifiers 32 with j<k. The j sense amplifiers 32 are activated or turned on for a time period sufficient for each of the sense amplifiers 32 to sense the signal on the connected column line 16 which is supplied from the associated multiplexer 30. The sense amplifier 32 is activated so that the signal can be latched and supplied to the shift register 34. After the signal from the sense amplifier 32 is latched into the shift register 34, the j sense amplifiers 32 are then deactivated and the signal stored in the shift register 34 is serially outputted to the data output terminal 36 in response to the clock signal.

Figure 2:
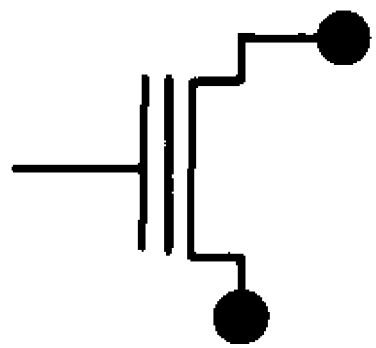
FIG. 2 is a circuit diagram of a non-volatile memory cell which can be used in the integrated circuit memory device which is shown in FIG. 1.

Referring to FIG. 2 there is shown a first embodiment of a non-volatile single storage transistor of the stacked gate floating gate type which can be used in each of the arrays 12 of the memory device 10. The operation of such a stacked gate floating gate storage transistor is well known in the art.

Figure 3:
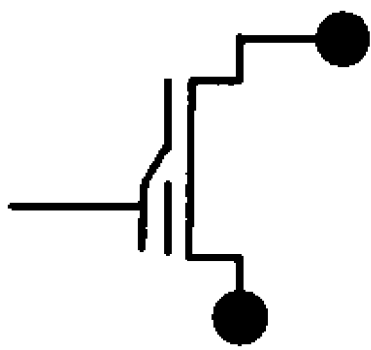
FIG. 3 is a circuit diagram of another non-volatile memory cell which can be used in the integrated circuit memory device shown in FIG. 1.

Referring to FIG. 3 there is shown a split gate floating gate storage transistor which can also be used in each of the arrays 12 of the memory device 10. Such a split gate floating gate storage transistor as shown in FIG. 3 can be operated in accordance with the teaching as disclosed in U.S. Pat. No. 5,029,130 whose disclosure is incorporated herein by reference in its entirety. In particular, the split gate floating gate storage transistor is programmed by hot channel electron injection and is erased by Fowler-Nordheim tunneling of electrons from the floating gate to the control gate.

Figure 4:
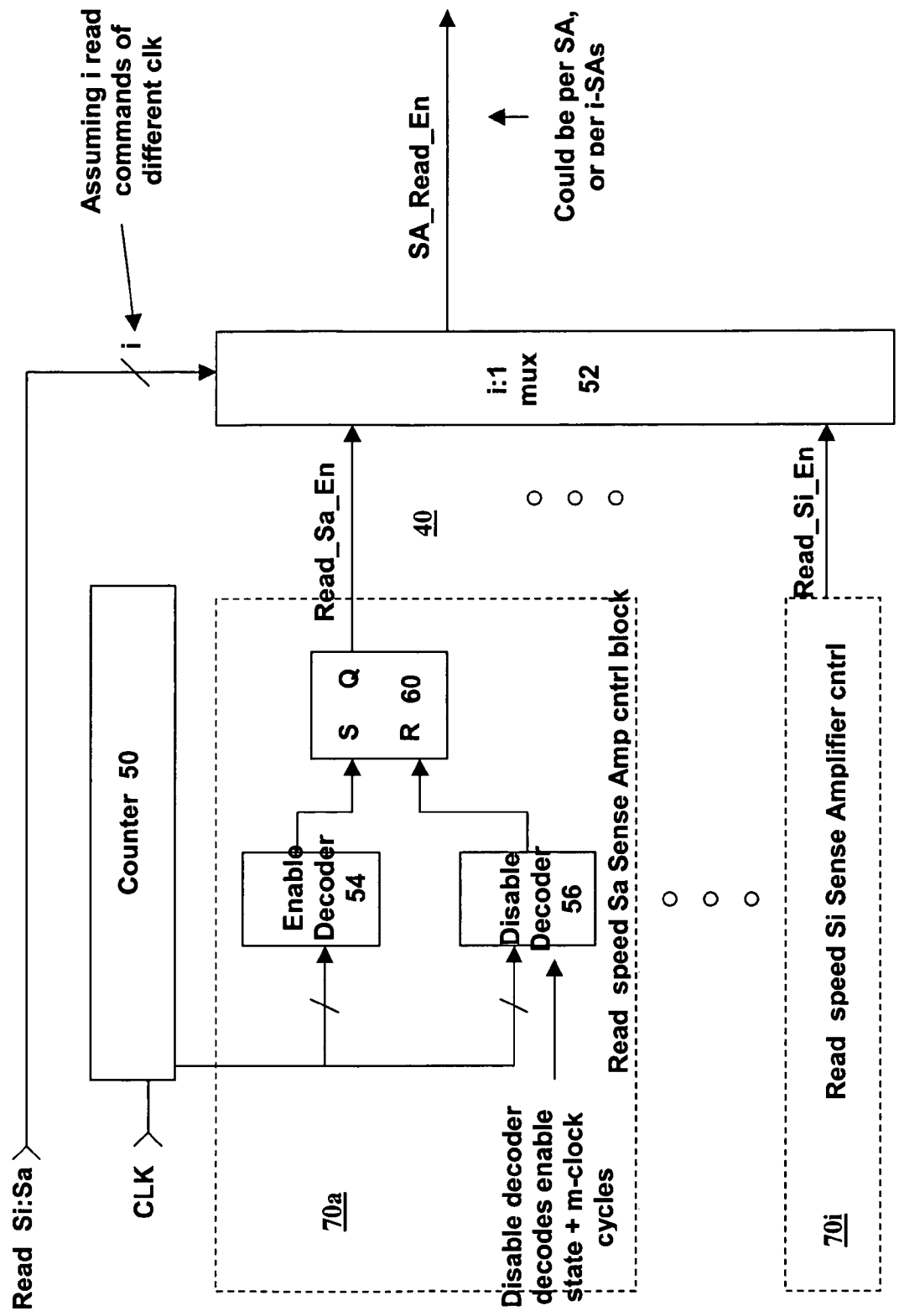
FIG. 4 is a block level schematic diagram of the control circuit portion of the integrated circuit memory device shown in FIG. 1.

Referring to FIG. 4 there is shown a schematic circuit of the control circuit 40 which is a portion of the memory device 10 of the present invention. The control circuit 40 comprises a plurality (i) of substantially identical read speed sense amplifier control block 70 (a–i). Each of the sense amplifier control block 70 has an enable decoder 54 and a disable decoder 56. The output of the enable decoder 54 is used to set a latch 60, while the output of the disable decoder 56 is used to reset the latch 60. The output of the latch 60 is the output of the sense amplifier control block 70. The outputs of all of the sense amplifier control blocks 70 (a–i) are provided to a multiplexer 52, which supplies the control signal to the sense amplifiers 32. There are i number of read speed sense amplifier control blocks 70, each for reading the sense amplifiers 32 at a different read speed that the device 10 supports. Each read speed uses a unique read command which is associated with a unique set of enable decoder 54, disable decoder 56 and S-R latch 60. One skilled in the art would recognize that some enable decoders 54 might be shared in common among the different control blocks 70. The read commands are supplied to the multiplexer 52 and are used to select the output of one of the read speed sense amplifier control blocks 70. Thus, the output of the multiplexer 52 is a single sense amplifier control line which is connected to the j sense amplifiers 32.

The control circuit 40 also comprises a counter 50. The output of the counter 50 is supplied to the enable decoder 54 and the disable decoder 56 of each of the sense amplifier control blocks 70. Each of the enable decoder 54 is turned "on" when the counter 50 starts. This sets the latch 60, such that the Q output is high. This is then supplied through the multiplexer 52 to the sense amplifier 32a to activate it. When the counter 50 reaches m clock cycles, the output of the counter 50 is used by the disable decoder 56 to out put a "high" which resets the latch 60. This turns the latch 60 off, causing the sense amplifier 30a to turn off. The multiplexer 52 sequences through the i outputs of the i sense amplifier control blocks 70 (a–i).

The operation of the memory device 10 is as follows. The memory device 10 decodes a read command serially and inputs it to the control circuit 40. The address signal is received at the address terminal 20 and is supplied to the row address decoder 24 and to the column address decoder 26. In response, selected column lines 16 and row line 14 are activated. The control circuit 40 also receives a clock signal. Using the clock speed information, and in response to the read command signal, the control circuit 40 activates a plurality (j) of the sense amplifiers 32 where j<k. The j sense amplifiers 32 are enabled for a time period equal to m clock cycles. In a preferred embodiment, m<n. The m clock cycle represents a time period which is long enough for the selected (j) sense amplifiers 32 to sense the signal that is present on the column line 16 supplied from each of the memory array 12 thereto. The time period that is required to sense the signal from the activated column line 16 is determined by the design of the sense amplifier 32 which is a function of the technology, the circuit design, etc. Once the designer of the sense amplifier has determined what the minimum time is required to sense a signal in order for the sense amplifier 32 to be able to determine if the bit is either a 0 or 1, that minimum time is translated into a number of clock cycles m, which depends upon the speed of the clock signal provided. In short, using the externally supplied clock signal, the read control circuit 40 is a timing device which activates each of the sense amplifiers 32 for the minimum time period sufficient for the sense amplifier 32 to determine the binary state of the signal in the column line 16. Once the sense amplifiers 32 have been activated for the m clock cycles, the signal that is determined by the sense amplifier 32 is supplied to the shift register 34 and is latched into the shift register 34. Thereafter, the sense amplifiers 32 are deactivated. The externally supplied clock signal is then used to clock out the binary signals stored in the shift register 34 serially onto the output terminal 36 in one bit per clock cycle. Thereafter, as the signals from the shift register 34 are serially outputted, the sense amplifiers 32 are enabled or activated to sense the signals on a different set of column lines. This sensing of the signals from the difference column lines 16 occur simultaneously with the output of the signals from the shift register 34.

Because the sense amplifiers 32 consume the largest amount of power, they are activated only for the limited minimum time period required to sense or determine the signal which is supplied on the column line 16. Once the signal is determined and is supplied to the shift register 34 where they are latched or stored, the sense amplifiers 32 are deactivated. However, to preserve the performance of the memory device 10 as the signals from the shift register 34 are clocked out serially, the sense amplifiers 32 are then activated again to sense the signals from a different address while simultaneously the signals from the shift register 34 are serially clocked out. In this way, performance does not suffer.

What is claimed is:

1. A memory device comprising:
 a plurality of memory cells arranged in a plurality of arrays, each array having a plurality of rows, and a plurality of column lines, and a plurality of row lines connecting to the memory cells in each array, wherein each memory cell in an array is addressable by a column line and a row line;
 a column address decoder for receiving a column address signal and for selecting one or more column lines of each array;
 a row address decoder for receiving a row address signal and for selecting a row line of each array;
 a plurality (k) of sense amplifiers, one sense amplifier associated with each array, connectable to one or more column lines of said array and for receiving a signal therefrom supplied from an addressed memory cell;
 a register; and
 a control circuit for receiving a read command, and a clock signal, and in response to the read command for determining a time period sufficient to sense the signal on a connected column line associated with each of a first plurality (j) of said plurality (k) of sense amplifiers (j<k); and for activating said first plurality (j) of sense amplifiers for said time period; and for latching the signal into said register; and for deactivating said first plurality (j) of sense amplifiers; and for serially outputting the signal from said register in response to said clock signal.

2. The device of claim 1 wherein said time period is m cycles of said clock signal.

3. The device of claim 2 wherein said control circuit further activates a second plurality (j) of said plurality (k) of sense amplifiers (j<k) for said time period simultaneously with said serially outputting the signal from said register in response to said clock signal.

4. The memory device of claim 2 wherein each of said memory cells is a split gate floating gate non-volatile memory cell having a first region in a semiconductor substrate, a second region in said semiconductor substrate spaced apart from said first region by a channel region; a floating gate for controlling the conduction of current in a first portion of said channel region; a control gate for controlling the conduction of current in a second portion of said channel region; wherein said control gate is separated from said floating gate by an insulator permitting the Fowler Nordheim tunneling of electrons from said floating gate to said control gate.

5. The memory device of claim 2 wherein each of said memory cells is a stacked gate floating gate non-volatile memory cell having a first region in a semiconductor substrate, a second region in said semiconductor substrate spaced apart from said first region by a channel region; a floating gate for controlling the conduction of current in said channel region; a control gate capacitively coupled to said floating gate.

6. A method of managing power in a memory device having a plurality of memory cells arranged in a plurality (k) of arrays, each array having a plurality of rows, and one or more column lines, and a plurality of row lines connecting to the memory cells in each array, wherein each memory cell in an array is addressable by a column line and a row line, a plurality (k) of sense amplifiers, one sense amplifier associated with each array, connectable to one or more column lines of said array and for receiving a signal therefrom supplied from an addressed memory cell; a register; and a control circuit for receiving a read command, and a clock signal, and in response to the read command for controlling said plurality of sense amplifiers and said register; said method comprising:

determining a time period sufficient to sense the signal on a connected column line associated with each of a first plurality (j) of said plurality (k) of sense amplifiers (j<k);

activating said first plurality (j) of sense amplifiers for said time period;

latching the signal into said register;

deactivating said first plurality (j) of sense amplifiers; and serially outputting the signal from said register in response to said clock signal.

7. The method of claim 6 wherein said time period is m cycles of said clock signal.

8. The method of claim 6 wherein said method further comprising:

activating a second plurality (j) of said plurality (k) of sense amplifiers (k) for said time period simultaneously with said serially outputting the signal from said register in response to said clock signal.

* * * * *